United States Patent
Gainey et al.

(10) Patent No.: US 6,313,519 B1
(45) Date of Patent: Nov. 6, 2001

(54) SUPPORT FOR SEMICONDUCTOR BOND WIRES

(75) Inventors: Trevor C. Gainey, Aylesford; Niko Miaoulis, Gravesend, both of (GB)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 08/424,828

(22) Filed: Apr. 19, 1995

Related U.S. Application Data

(63) Continuation of application No. 07/914,621, filed on Jul. 15, 1992, now abandoned.

(30) Foreign Application Priority Data

Jul. 17, 1991 (GB) .................................................. 9115463

(51) Int. Cl.[7] .................................................. H01L 23/495
(52) U.S. Cl. .................................................. 257/676; 257/666
(58) Field of Search ..................................... 257/676, 666

(56) References Cited

U.S. PATENT DOCUMENTS 4,771,330 * 9/1988 Long .
4,903,114 * 2/1990 Hoki et al. ............................ 257/666
5,168,368 12/1992 Gow, 3rd et al. .

FOREIGN PATENT DOCUMENTS

| 0078606 | 5/1983 | (EP) . |
| 0247644 * | 12/1987 | (EP) . |
| 0259222 * | 3/1988 | (EP) . |
| 0311513 * | 10/1990 | (EP) . |
| 0513591 | 11/1992 | (EP) . |

\* cited by examiner

Primary Examiner—Sheila V. Clark

(57) ABSTRACT

A support structure is provided between, preferably approximately midway between, a semiconductor die and the inner ends of the lead fingers of a lead frame. Intermediate portions of bond wires connecting the die to the lead fingers are bonded, or tacked, to an upper surface of the support structure. In this manner, the length of the bond wires can be doubled, and the lead fingers can be commensurately further from the die so that a greater number of lead fingers of a given size and spacing can be provided, while avoiding the problems associated with long bond wires.

23 Claims, 3 Drawing Sheets

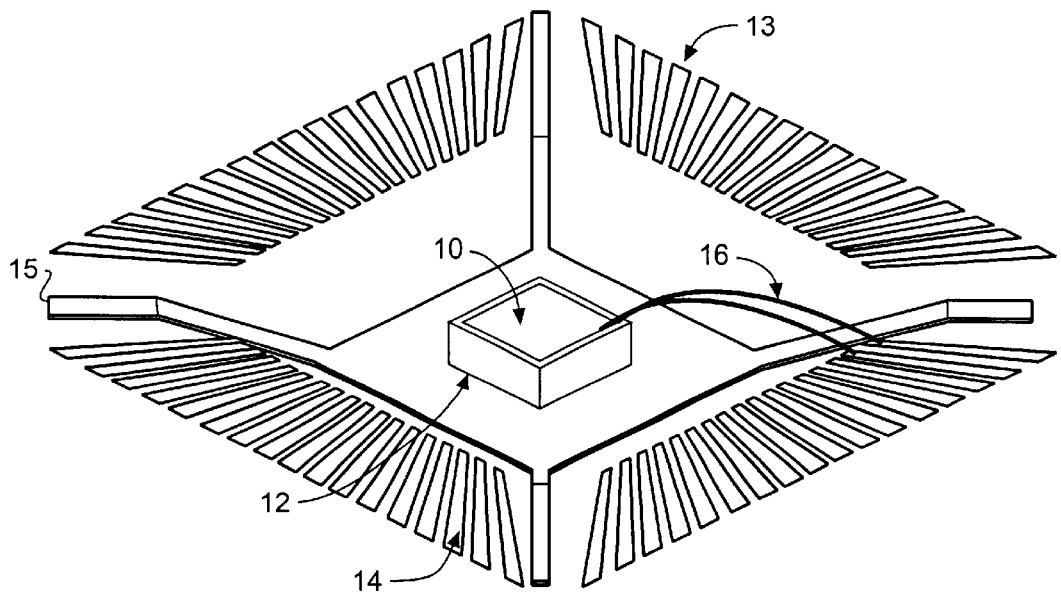
FIG._1
(PRIOR ART)
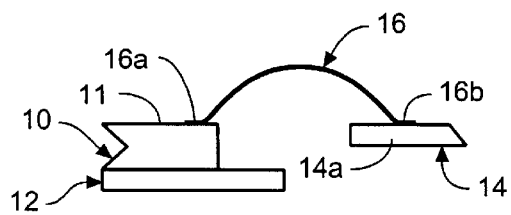
FIG._2
(PRIOR ART)

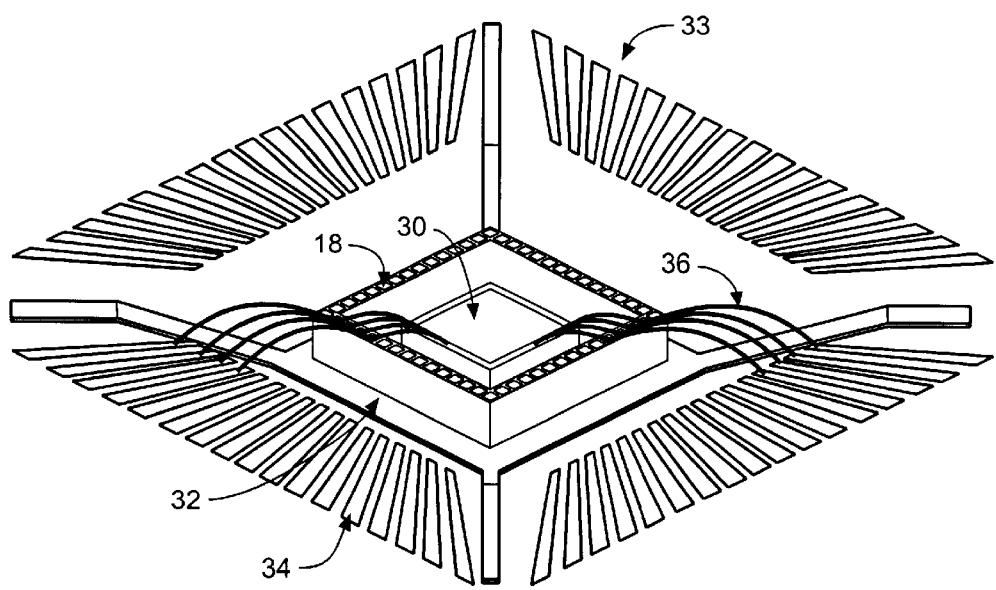
FIG._3
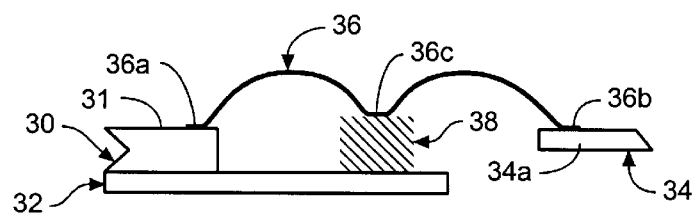
FIG._4

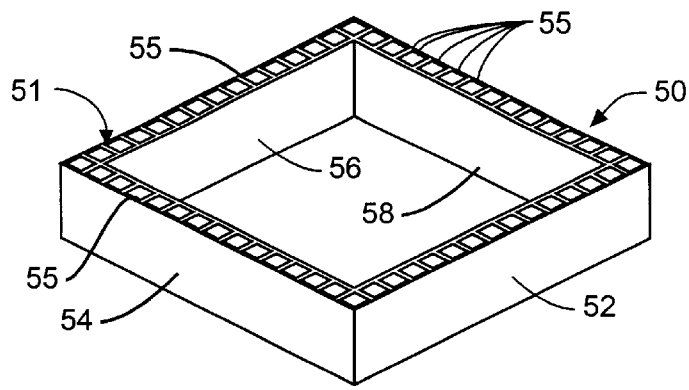
FIG._5
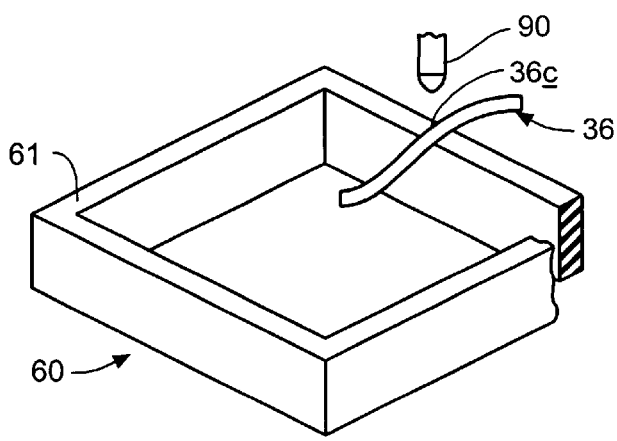
FIG._6
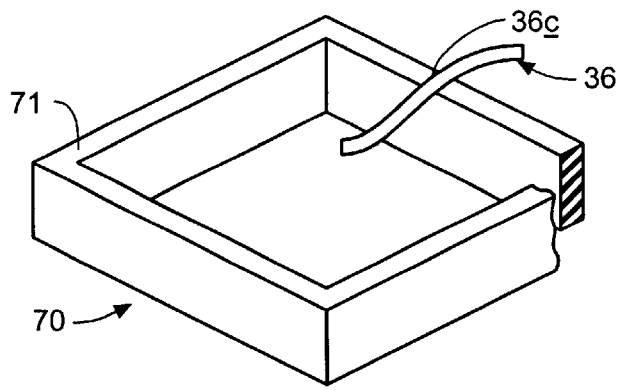
FIG._7
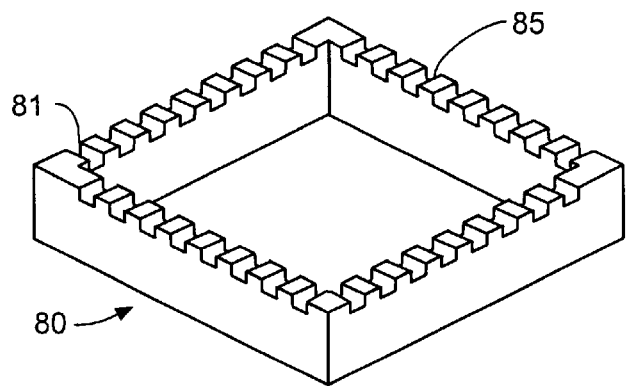
FIG._8

SUPPORT FOR SEMICONDUCTOR BOND WIRES

This is a Continuation of application Ser. No. 07/914,621, filed Jul. 15, 1992, now abandoned.

TECHNICAL FIELD

The invention relates to the packaging of microelectronic circuits and, more particularly, to wire bonding dies to lead frames or the like.

BACKGROUND

There are various techniques of packaging a semiconductor die (microelectronic circuit), such as in a ceramic package, on a printed wiring board, in a plastic molded body, or on a tape. The latter two (plastic molded, tape) are representative of packaging techniques that employ lead frames. A lead frame is a generally planar layer of conductive material, patterned to have a plurality of conductor lines (lead fingers) radiating from a central area where the semiconductor die is located. For ceramic and printed wiring board packages, there is generally an analogous pattern of conductors on a insulating substrate (e.g., ceramic, FR4).

Irrespective of the type of package, the die must be connected to the inner ends of the lead fingers. One well-known way to effect this connection is by using bond wires attached at one end to bond pads on the die, and attached at their other end to the inner ends of the lead fingers. Bond wires are on the order of one thousandth of an inch, or less, in diameter. Bond pads are on the order of a few thousandths of an inch, spaced from one another on the order of one thousandth of an inch. Evidently, when many bond wires are connected to a die, this is a very crowded situation, and there is the possibility of these bond wires shorting against one another, breaking, and other related problems. This problem is exacerbated in plastic molded packaging, wherein a die is mounted to a lead frame, wire bonded thereto, inserted into a mold, and covered with plastic. The influx of plastic into the mold can cause movement of the closely-spaced bond wires, resulting in a defective packaged component. Coming this late in the process (during packaging), defects due to bond failure are generally irreversible and expensive.

The trend in microelectronics is to use smaller, denser semiconductor chips (dies) which have more functionality and which require more input/output (I/O) connections. Generally, each I/O connection requires a bond wire. It is therefore becoming increasingly difficult to package such chips (dies), especially in plastic packages, due to lead frame and bonding limitations.

FIGS. 1 and 2 illustrate a conventional technique of bonding a die 10 to a lead frame 13, such as for plastic packaging. Only a relevant, inner portion of the lead frame is shown in these illustrations. The lead frame 13 includes a plurality of conductive lines (lead fingers) 14 arranged in a generally radial pattern from a central area. The lead frame 13 further includes a die paddle 12, within the central area, and upon which rests the die 10. The die paddle 12 is preferably somewhat larger (in area) than the die. Tiebars 15 extend radially outward from the four corners of the die paddle 12 to an outer structure of the lead frame (not shown), to support the die paddle. As best viewed in the cross-section of FIG. 2 (tiebars omitted from this view), the die paddle 12 is depressed below the plane of the lead fingers 14. This is a fairly common practice, for plastic packaging (transfer molding). In FIG. 1, there are illustrated two of many bond wires 16, extending at one end 16a from a bond pad on a peripheral portion of the top face 11 of the die 10 to another end 16b connected to inner ends 14a of the lead fingers 14. As mentioned above, there may be hundreds of such bond wires, closely spaced, and subject to deformation during the plastic molding process.

If one is working at the lowest possible limit of lead resolution and spacing, the only way to accommodate more leads 14 is to move them further away from the chip—in other words to increase the gap between the die and the inner ends of the lead fingers. (As illustrated in FIG. 1, the lead fingers radiate, or spread out, from the central area containing the die. By terminating the inner ends of the lead fingers at a greater distance from the die, they are inherently further apart from one another.)

By moving the lead fingers further away from the die, it is evident that the bond wires need to be longer. Returning to FIG. 2, it is evident that the bond wires span a "gap" between the die 10 and the inner ends of the lead fingers 14. The bigger the gap, the longer the bond wires. Longer bond wires simply exacerbate the aforementioned problems of shorting, breaking, etc. Due to mechanical and molding considerations, the length of the bond wires 16 is the limiting factor in how far back one can position the leads. The maximum permissible single span of bond wire is on the order of 3–5 millimeters (mm), depending upon the application. Viewed another way, mechanical considerations vis-a-vis the (length of the) bond wires tend to limit the number of lead fingers, hence the I/O count, of a semiconductor device. This certainly seems antithetical in this day and age of miniaturization.

SUMMARY

It is therefore an object of the present invention to provide an improved technique for wire bonding, which permits the use of a greater number of lead fingers, hence a greater I/O count, irrespective of a large gap between the lead fingers and the die.

It is a further object of the present invention to enable longer lengths of bond wire to be used, thereby enabling the lead frame (fingers) to be positioned further away from the chip (die) and enable more leads (fingers) to be accommodated.

According to the present invention, a support means is provided between, preferably approximately midway between, the die and the inner ends of the lead fingers of a lead frame. Intermediate portions of the wires are bonded, or tacked, to an upper surface of the support means. In this manner, the length of the bond wires can be doubled, and the lead fingers can be commensurately further from the die, while avoiding the problems associated with long bond wires.

The support means is preferably a continuous element extending "circumferentially" (in a square sense of the term) around the chip (die). In a sense, the support means forms a "way station" for stabilizing the bond wires.

The upper surface of the support means is preferably provided with bond pads, to which the intermediate portions of the bond wires are bonded.

Alternatively, the support means can be formed of an insulating material, and the intermediate portions of the bond wires tacked thereto with a suitable adhesive.

Alternatively, the support means can be provided with a plurality of notches on its upper surface, each notch retaining and locating the intermediate portion of a respective bond wire.

Other objects, features and advantages of the invention will become apparent in light of the following description thereof.

DRAWINGS

FIG. 1 is a perspective view of a generalized lead frame, die, and bond wires, according to the prior art.

FIG. 2 is a cross-sectional view of a portion of the apparatus of FIG. 1.

FIG. 3 is a perspective view of a generalized lead frame, die, bond wires and support means, according to the present invention.

FIG. 4 is a cross-sectional view of a relevant portion of the apparatus of FIG. 3.

FIG. 5 is a perspective view, partially broken away, of a support means, according to one embodiment of the invention.

FIG. 6 is a perspective view, partially broken away, of a support means, according to another embodiment of the invention.

FIG. 7 is a perspective view, partially broken away, of a support means, according to another embodiment of the invention.

FIG. 8 is a perspective view, partially broken away, of a support means, according to yet another embodiment of the invention.

DESCRIPTION

FIGS. 1 and 2 show conventional mounting and connecting of a semiconductor die to a lead frame, according to the prior art. The problems associated with needing to increase the gap between the lead fingers and the die, to accommodate a higher lead count, and the attendant problems with the resulting bond wire length have been discussed, hereinabove.

FIG. 3 shows a semiconductor die 30 mounted to a paddle 32 of a lead frame 33. The lead frame has a plurality of lead fingers 34 extending (radiating) from the area of the die (and paddle), outwards, as in the prior art. Bond wires 36 connect the die to the lead fingers, as in the prior art.

In marked departure from the prior art, a support means 38 is provided around the die 30, approximately midway between the die and the inner ends of the lead fingers. The support means 38 forms a continuous support wall around the chip (die) 30. As shown in FIG. 4, the support means 38 rests atop the die paddle 32 (on the same side of the die paddle as the die), and approximately bisects the gap between the outer edge (periphery) of the die and the inner ends 34a of the lead fingers 34.

As in the prior art, the bond wire 36 spans the gap between the die and the inner end 34a of the lead finger 34, and is bonded at one end 36a to the top surface 31 of the die 30, and is bonded at the other end 36b to the inner end 34a of the lead finger.

However, the bond wire 36 may be much longer than the bond wire 16 of the prior art, without the problems discussed hereinabove. This is due to the fact that an intermediate portion 36c of the bond wire is affixed to the top surface of the support means 38. In this manner, the length of the bond wire 36 between its inner end 36a and its intermediate portion 36c can be on the order of 3–5 mm, and the length of the bond wire between its intermediate portion 36c and its outer end 36b can also be 3–5 mm. Hence, the overall length of the bond wire can be on the order of 6–10 mm, while only two 3–5 mm portions thereof are unsupported. This effectively doubles the usable length of the bond wire, vis-a-vis the prior art (which was limited to an overall length of 3–5 mm). This means that the inner ends of the lead fingers can be effectively twice as far away from the die as in the prior art, and consequently there can be more lead fingers of a given size and spacing. (Since the lead fingers are arranged in a generally radial, spreading-out manner, the further away from the die, the more space there is available for more lead fingers.) In this manner, the lead count, or I/O count of the semiconductor device can keep apace of the complexity of the circuit contained on the die.

The support means (or "wire jumper") 38 is preferably attached to the die paddle 32, in the area of the die paddle extending beyond the die, and is made of a molded plastic material or any other suitable material. A suitable material would be an insulating material, for bare (un-insulated) bond wires, since it would be extremely undesirable for the bond wires to short out on the support means 38. For insulated bond wires, an electrically conductive material could be employed for the support means, so long as the bond wires are not shorted thereto.

FIG. 5 shows one embodiment of the support means 38 of FIGS. 3 and 4. Herein, a support means 50 is a box-like structure, having four side walls 52, 54, 56 and 58. The interior of the support means 50 is suitably sized to surround the die, and to approximately bisect the gap between the die and the inner ends of the lead fingers. The height of the side walls is conveniently established to be approximately as high, or slightly higher, than the thickness of the die. (See FIG. 4 to visualize this.) Preferably, when the support means 50 is mounted to the die paddle, the upper surface 51 of the support means is at a height higher than the front surface 31 of the die and lower than the lead fingers. In this manner, the support means not only bisects the lateral gap between the die and the inner ends of the lead fingers, but also serves as a "step up" for the bond wire as it elevates from the depressed level of the die to the level of the lead fingers.

FIG. 5 shows a number of connecting (bond) pads 55, one per bond wire, disposed on the top surface 51 of the support means. These bond pads 55 may be similar to those on the die (not shown), in that they may simply be solder areas. In this manner, the intermediate portions 36c of the bond wires 36 can be bonded to the support means using similar techniques as are employed for bonding the ends 36a and 36b of the bond wire to the die and lead fingers, respectively.

FIG. 6 shows another embodiment of the support means 38 of FIGS. 3 and 4. Herein, the support means 60 is four-walled structure, as is the support means 50. However, in this case, the support means is formed of a plastic material, such as nylon, as indicated by the alternating fine and coarse cross-hatching. The intermediate portions 36c of the bond wires 36 are bonded in any suitable manner, such as ultrasonic bonded to the upper surface 61 of the support means 60. This is indicated by the tip 90 of an ultrasonic bonding tool positioned above the bond wires 36. An adhesive may also be used to bond the wires to the upper surface of the support means.

FIG. 7 shows another embodiment of the support means 38 of FIGS. 3 and 4. Herein, the support means 70 is four-walled structure, as is the support means 50. However, in this case, the support means is formed of an insulating metallic material, such as anodized aluminum, as indicated by the uniform cross-hatching. The intermediate portions 36c of the bond wires 36 are bonded in any suitable manner, such as with dollops 92 of adhesive, to the upper surface 71 of the support means 70.

FIG. 8 shows another embodiment of the support means 38 of FIGS. 3 and 4. Herein, the support means 80 is four-walled structure, as is the support means 50. In this case, the upper surface 81 of the support means is provided with a plurality of grooves (notches) 85, one per bond wire, for locating and retaining the intermediate portions 36c of the bond wires 36. To this end, the grooves are wide enough and deep enough to form a slight interference fit with the bond wire, i.e. on the order of one thousandth of an inch (or less, depending on the diameter of the bond wire). In this manner, the intermediate portions of the bond wires are directly mechanically supported. Given that the die is ultimately encapsulated in plastic (for molded plastic packages), or covered with a glob top epoxy (for tape-based packages), the plastic (or epoxy) will positively fix the bond wires into the notches 85.

Such a completed, packaged die, with lead frame, as discussed hereinabove, is termed a "semiconductor device assembly"

In any of the above embodiments, the support means (wire jumper) substantially doubles the effective (actual) length of the bond wire between the chip (die) and the lead frame, with each unsupported span of the bond wire not exceeding the maximum permissible length (e.g., 3–5 mm). The bond wires are preferably stitch bonded onto the sire jumper during the bonding process.

The support means (of any embodiment) may be pre-assembled to the lead frame, prior to mounting the semiconductor die and prior to connecting the die with the bond wires. A lead frame having the support means of the present invention is termed a "composite lead frame".

What is claimed is:

1. Composite lead frame, comprising:
   a lead frame having a plurality of lead fingers radiating from a central area, and a die paddle located in the central area; and
   support means disposed on the die paddle, for supporting intermediate portions of bond wires extending from a die on the die paddle to the lead fingers, each bond wire extending continuously as one wire from the die to a corresponding lead finger, wherein an electrical connection is established from the die to said corresponding lead finger based exclusively on said one wire, each intermediate portion being affixed to the support means.

2. Composite lead frame, according to claim 1, wherein:
   the support means includes bond pads for bonding the intermediate portions of the bond wires to an upper surface of the support means.

3. Composite lead frame, according to claim 1, wherein:
   the support means includes notches in a surface thereof, for receiving the intermediate portions of the bond wires.

4. Semiconductor Device Assembly, comprising:
   a lead frame having a plurality of lead fingers radiating from a central area, and a die paddle located in the central area;
   a semiconductor die disposed on the die paddle;
   bond wires, each extending continuously as on wire from the die to the lead fingers; and
   support means, disposed on the die paddle between the die and inner ends of the lead fingers, for supporting intermediate portions of the bond wires, each bond wire extending continuously from the die to a corresponding lead finger, wherein an electrical connection is established from the die to said corresponding lead finger based exclusively on said one wire, each intermediate portion being affixed to the support means.

5. Semiconductor Device Assembly, according to claim 4, wherein:
   the support means is disposed approximately midway between the die an the inner ends of the lead fingers.

6. Composite lead frame according to claim 1, wherein:
   the support means is formed of an insulating material.

7. Composite lead frame, according to claim 1, wherein:
   the support means includes bond pads for bonding the intermediate portions of the bond wires to an upper surface of the support means; and
   the notches are sized to receive the bond wires with an interference fit.

8. Semiconductor Device Assembly, according to claim 4, wherein:
   the support means is formed of an insulating material.

9. Semiconductor Device Assembly, according to claim 8, wherein:
   the support means is formed of a plastic material.

10. Semiconductor Device Assembly, according to claim 9, wherein:
    the support means is formed of nylon.

11. Semiconductor Device Assembly, according to claim 8, wherein:
    the support means is formed of metal.

12. Semiconductor Device Assembly, according to claim 4, wherein:
    the support means includes notches in a surface thereof, for receiving the intermediate portions of the bond wires; and
    the notches are sized to receive the bond wires with an interference fit.

13. Semiconductor Device Assembly, according to claim 4, wherein:
    the support means includes bond pads for bonding the intermediate portions of the bond wires to an upper surface of the support means.

14. Semiconductor Device Assembly, according to claim 4, wherein:
    the support means includes notches in a surface thereof, for receiving the intermediate portions of the bond wires.

15. Composite lead frame, according to claim 1, wherein:
    each lead finger has an inner end; and
    the support means is disposed approximately midway between the die and the inner ends of the lead fingers.

16. Composite lead frame, according to claim 1, wherein:
    the support means is formed of a plastic material.

17. Composite lead frame according to claim 6, wherein:
    the support means is formed of metal.

18. A semiconductor device assembly, comprising:
    a semiconductor die paddle;
    a semiconductor die located on the semiconductor die paddle;
    a lead frame surrounding the semiconductor die, the lead frame having a plurality of lead fingers radiating from the semiconductor die;
    a plurality of bond wires electrically coupling the lead frame to the semiconductor die, each bond wire extending continuously as one wire from a lead finger to the semiconductor die; and a support structure disposed on the die paddle between the semiconductor die and inner ends of the lead fingers, the support structure having bond pads bonded to intermediate portions of the bond wires thereby providing intermediate support to the bond wires.

19. The semiconductor device assembly in claim 18 wherein the support structure is composed of a material from the group consisting of plastic, nylon and metal.

20. The semiconductor device assembly in claim 18 wherein the support structure is disposed approximately midway between the semiconductor die and the inner ends of the lead fingers.

21. A semiconductor device assembly, comprising:

a semiconductor die paddle;

a semiconductor die located on the semiconductor die paddle;

a lead frame surrounding the semiconductor die, the lead frame having a plurality of lead fingers radiating from the semiconductor die;

a plurality of bond wires electrically coupling the lead frame to the semiconductor die, each bond wire extending continuously as one wire from a lead finger to the semiconductor die; and a support structure disposed on the die paddle between the semiconductor die and inner ends of the lead fingers, the support structure having notches providing an interference fit with intermediate portions of the bond wires thereby providing intermediate support to the bond wires.

22. The semiconductor device assembly in claim 21 wherein the support structure is composed of a material from the group consisting of plastic, nylon and metal.

23. The semiconductor device assembly in claim 21 wherein the support structure is disposed approximately midway between the semiconductor die and the inner ends of the lead fingers.

* * * * *